(12) United States Patent
Ishino (10) Patent No.: US 9,570,362 B2
(45) Date of Patent: Feb. 14, 2017

(54) METHOD FOR MANUFACTURING SEMICONDUCTOR DEVICE AND SEMICONDUCTOR DEVICE

(71) Applicant: CANON KABUSHIKI KAISHA, Tokyo (JP)

(72) Inventor: Hideaki Ishino, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/700,379

(22) Filed: Apr. 30, 2015

(65) Prior Publication Data
US 2015/0325609 A1 Nov. 12, 2015

(30) Foreign Application Priority Data

May 8, 2014 (JP) .................................. 2014-097110

(51) Int. Cl.
*H01L 21/8238* (2006.01)
*H01L 27/146* (2006.01)
(Continued)

(52) U.S. Cl.
CPC ... *H01L 21/823857* (2013.01); *H01L 21/0206* (2013.01); *H01L 21/26513* (2013.01);
(Continued)

(58) Field of Classification Search
CPC .................... H01L 21/28185; H01L 21/823857
See application file for complete search history.

(56) References Cited

U.S. PATENT DOCUMENTS 4,961,820 A * 10/1990 Shinagawa ....... H01L 21/31138
134/1.2
5,201,960 A * 4/1993 Starov ............... H01L 21/67023
134/11
(Continued)

FOREIGN PATENT DOCUMENTS

JP          9-092827 A     4/1997
JP       2004-282068 A    10/2004
(Continued)

OTHER PUBLICATIONS

McVittie, Jim, "HBr and NF3 based silicon etching", 2008 NNIN Etch workshop, pp. 1-17.*
(Continued)

*Primary Examiner* — Dale E Page
*Assistant Examiner* — Vincent Wall
(74) *Attorney, Agent, or Firm* — Fitzpatrick, Cella, Harper & Scinto (57) ABSTRACT

A method for manufacturing a semiconductor device including a MOS transistor comprising forming a gate electrode on a first insulating film formed on a substrate, performing ion implantation into the substrate and forming a diffusion region, and forming a second insulating film on the substrate, in that order. The performing ion implantation comprises forming a first resist pattern, performing the ion implantation using the first resist pattern as a mask and removing the first resist pattern, including removing, by asking, a part of the first resist pattern hardened by the ion implantation and then removing the remaining part. In forming the gate electrode, a gate electrode material layer is patterned and a protective film is formed.

21 Claims, 11 Drawing Sheets

(51) Int. Cl.
*H01L 21/265* (2006.01)
*H01L 21/02* (2006.01)
*H01L 21/308* (2006.01)
*H01L 21/768* (2006.01)
*H01L 29/49* (2006.01)
*H01L 29/66* (2006.01)
*H01L 29/78* (2006.01)

(52) U.S. Cl.
CPC ........ *H01L 21/308* (2013.01); *H01L 21/7685* (2013.01); *H01L 27/146* (2013.01); *H01L 27/14612* (2013.01); *H01L 27/14689* (2013.01); *H01L 29/4983* (2013.01); *H01L 27/1461* (2013.01); *H01L 29/6659* (2013.01); *H01L 29/7833* (2013.01)

(56) References Cited

U.S. PATENT DOCUMENTS

| | | | | |
|---|---|---|---|---|
| 5,759,746 | A * | 6/1998 | Azuma | G03F 7/091 216/41 |
| 6,074,569 | A * | 6/2000 | Kiziloglu | H01L 21/31138 216/62 |
| 6,429,142 | B1 * | 8/2002 | Peng | H01L 21/02071 216/64 |
| 6,579,809 | B1 * | 6/2003 | Yang | H01L 21/0338 257/E21.039 |
| 7,067,370 | B2 | 6/2006 | Lee et al. | |
| 7,294,577 | B2 | 11/2007 | Oh et al. | |
| 8,551,873 | B2 | 10/2013 | Onuki et al. | |
| 2005/0167762 | A1 * | 8/2005 | Kadoshima | H01L 21/28176 257/392 |
| 2006/0214243 | A1 * | 9/2006 | Sakoda | H01L 21/28185 257/410 |
| 2010/0304554 | A1 | 12/2010 | Hidaka et al. | |

FOREIGN PATENT DOCUMENTS

| | | |
|---|---|---|
| JP | 2005-277146 A | 10/2005 |
| JP | 2009-170554 A | 7/2009 |
| JP | 2009-277771 A | 11/2009 |
| JP | 2009-277816 A | 11/2009 |
| JP | 2013-084694 A | 5/2013 |

OTHER PUBLICATIONS

Hattori et al., "Novel Single-Wafer Single-Chamber Dry and Wet Hybrid System for Stripping and in Situ Cleaning of High-Dose Ion-Implanted Photoresists", IEEE trans. Semi. Manufac., vol. 22, No. 4, 2009, pp. 468-474.*

* cited by examiner

LINE WIDTH OF PHOTORESIST PATTERN BEFORE ASHING:0.8um

|  | DOSE | PRESENCE/ABSENCE OF RESIST RESIDUE |
|---|---|---|
| CONDITION 1 | $3E13/cm^2$ | ABSENT |
| CONDITION 2 | $2E14/cm^2$ | PRESENT |
| CONDITION 3 | $1E15/cm^2$ | PRESENT |
| CONDITION 4 | $4E15/cm^2$ | PRESENT |

METHOD FOR MANUFACTURING SEMICONDUCTOR DEVICE AND SEMICONDUCTOR DEVICE

BACKGROUND OF THE INVENTION

Field of the Invention

The present invention relates to a method for manufacturing a semiconductor device and a semiconductor device.

Description of the Related Art

As a method for reducing characteristic variations of a MOS transistor in a semiconductor device, a technique of covering the MOS transistor after gate electrode etching with a protective film is proposed (see Japanese Patent Laid-Open No. 2013-84694).

According to Japanese Patent Laid-Open No. 2013-84694, a protective film is formed through gate electrode etching or process treatment executed subsequently thereto, then process treatment such as formation of a diffusion layer is performed and an insulating film is formed so as to cover the protective film. At this time, the insulating film is formed without removing the protective film.

According to Japanese Patent Laid-Open No. 2013-84694, variations in MOS transistor characteristics are reduced by forming the protective film on a surface of a semiconductor substrate immediately after the gate electrode etching. After forming the protective film, ion implantation is performed on the semiconductor substrate and a diffusion region is formed, and in that case, ion implantation is also performed on a photoresist pattern. However, ashing performed on the ion-implanted photoresist pattern is not particularly taken into consideration. When ashing is performed on the resist pattern, residues of the resist may be generated. Removal of the residues of this resist requires specific cleaning processing. In that case, the protective film which is based on a silicon oxide film is wet-etched and part or the whole thereof is removed, which may consequently cause the loss of the function as the protective film. When there is no protective film, the gate insulating film is wet-etched and part or the whole thereof is removed, which may consequently cause deterioration in the reliability of the transistor.

SUMMARY OF THE INVENTION

In contrast, an aspect of the present invention provides a technique capable of removing a resist while maintaining reliability of the transistor.

According to some embodiments, a method for manufacturing a semiconductor device including a MOS transistor is provided. The method comprising a step of forming a gate electrode on a first insulating film formed on a semiconductor substrate, a first implantation step of performing ion implantation into the semiconductor substrate and forming a first diffusion region, and a step of forming a second insulating film on the semiconductor substrate, in that order, wherein the first implantation step comprises a step of forming a first resist pattern for performing the ion implantation, a step of performing the ion implantation using the first resist pattern as a mask, and a first removing step of removing the first resist pattern, including removing, by asking, a part of the first resist pattern hardened by the ion implantation and then removing the remaining part through cleaning with a sulfuric acid-hydrogen peroxide mixture, in the step of forming the gate electrode, a gate electrode material layer formed on the first insulating film is patterned and a protective film to protect at least a lower part of a side face of the gate electrode and a part of the first insulating film adjacent to the side face is formed, and in the step of forming the second insulating film, the second insulating film is formed so as to cover the protective film.

Further features of the present invention will become apparent from the following description of exemplary embodiments (with reference to the attached drawings).

DESCRIPTION OF THE EMBODIMENTS

Hereinafter, embodiments of the present invention will be described with reference to the accompanying drawings.

Embodiment 1

An embodiment of the present invention relates to a method for manufacturing a semiconductor device including a MOS transistor. An example of a solid-state image sensor will be described as a semiconductor device including a MOS transistor as an embodiment of the present invention with reference to FIG. 1.

Figure 1:
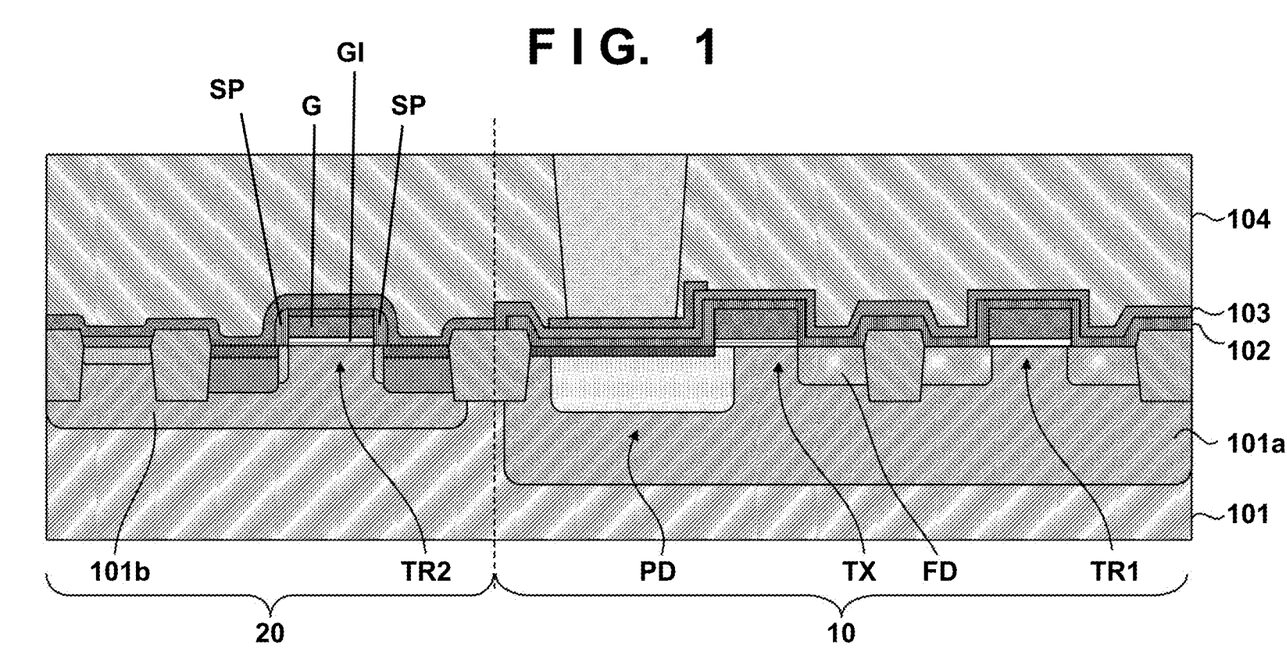
FIG. 1 is a cross-sectional view schematically illustrating part of a pixel unit of a solid-state image sensor and part of its periphery as an example of a semiconductor device.

FIG. 1 is a cross-sectional view schematically illustrating a configuration of a solid-state image sensor as an example of a semiconductor device. The solid-state image sensor includes a pixel unit 10 in which pixels having a photoelectric conversion element PD are arrayed and a peripheral circuit unit 20 for reading signals of the pixels from the pixel unit 10. As typical components of the pixel unit 10, FIG. 1 shows one photoelectric conversion unit PD, a transfer MOS transistor (transfer gate) TX that transfers charge accumulated in the photoelectric conversion unit PD to a floating diffusion FD and one MOS transistor TR1. The MOS transistor TR1 can be, for example, an amplifier transistor, a reset transistor or a selection transistor. The diffusion region making up the photoelectric conversion unit PD, floating diffusion FD, transfer MOS transistor TX, and MOS transistor TR1 can be arranged, for example, in a well 101a formed in a semiconductor substrate 101. FIG. 1 illustrates one MOS transistor TR2 as a typical component of the peripheral circuit unit 20. The diffusion region making up the MOS transistor TR2 can be arranged in a well 101b formed, for example, in the semiconductor substrate 101.

In the pixel unit 10, MOS transistors including the transfer MOS transistor (transfer gate) TX and the MOS transistor TR1 are formed. Insulating films such as a silicon nitride film 102, a silicon oxide film 103, interlayer insulating film 104 or the like are formed on the protective film that covers these MOS transistors. On the other hand, in the peripheral circuit unit 20, the protective film on the top surface of the gate electrode G of the MOS transistor TR2 is removed. However, the protective film remains between a side spacer SP and the gate electrode G, and between the side spacer and the gate insulating film GI.

Hereinafter, the method for manufacturing a semiconductor device including the MOS transistor in the above-described peripheral circuit unit 20 will be described as an embodiment of the present invention with reference to FIG. 2A to FIG. 8C. First, in steps shown in FIG. 2A, a first insulating film 205 is formed on a semiconductor substrate 201 including an element separating film 202, a P-type well 203 and an N-type well 204, and a gate electrode material layer 206 is then formed on the first insulating film 205. Here, the semiconductor substrate 201 can be a silicon substrate. The first insulating film 205 can be a silicon oxide film formed by thermally oxidizing the silicon substrate. The gate electrode material layer 206 can be a polysilicon layer. The gate electrode material layer 206 can be formed using, for example, a CVD method.

Figure 2A:
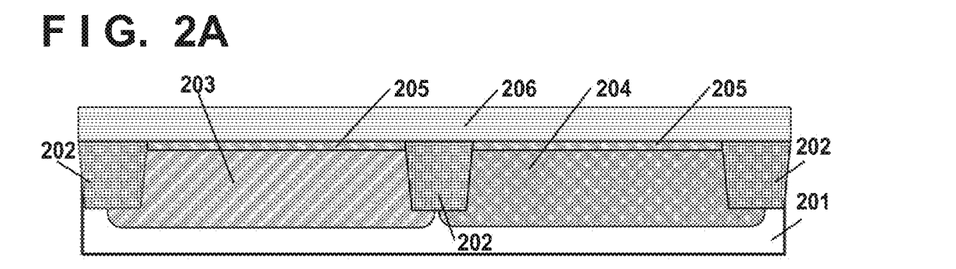
FIGS. 2A to 2D illustrate manufacturing steps of a semiconductor device corresponding to Embodiment 1 of the present invention.
Figure 2B:
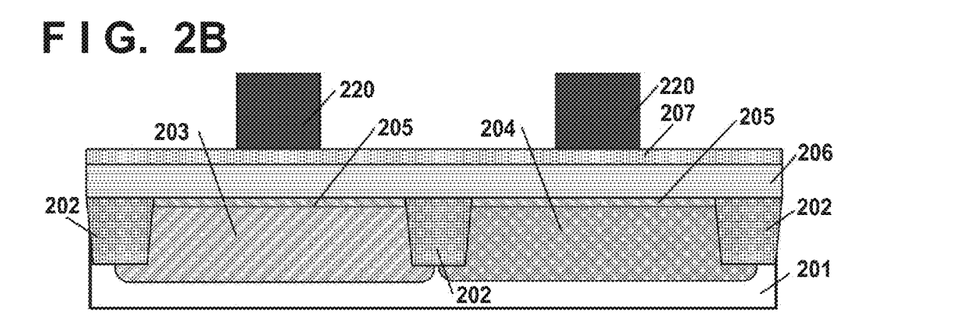
Figure 2C:
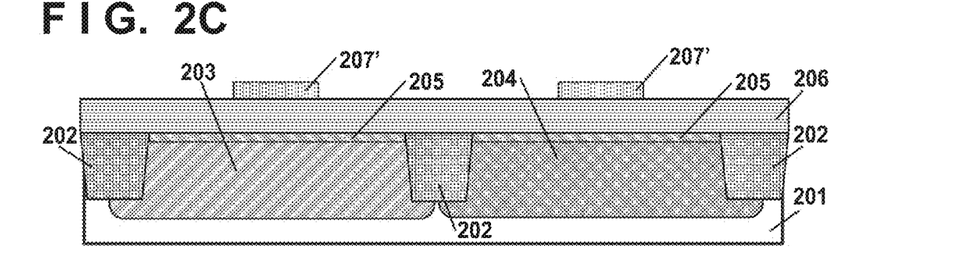

Next, in steps shown in FIGS. 2B and 2C, an etching mask 207' is formed on the gate electrode material layer 206. More specifically, in the steps shown in FIGS. 2B and 2C, an insulating film 207 is formed on the gate electrode material layer 206 and a photoresist pattern 220 is formed on the insulating film 207. Next, using the photoresist pattern 220 as a mask, the insulating film 207 is etched. In this way, the insulating film 207 is patterned and the etching mask 207' is formed. The photoresist pattern 220 can be removed after the etching mask 207' is formed. The insulating film 207 can be a silicon oxide film.

Figure 2D:
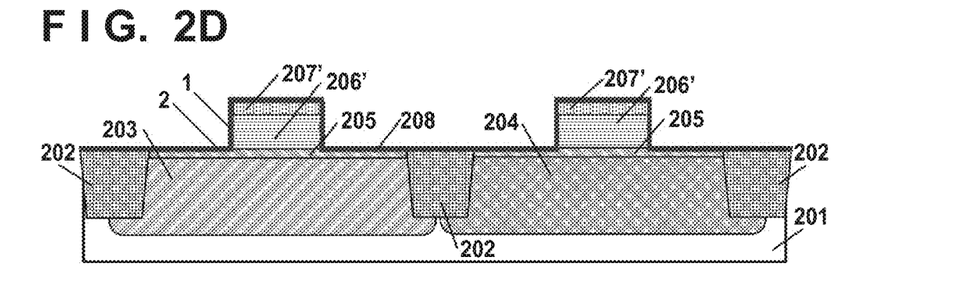

Next, in a step shown in FIG. 2D, a gate electrode 206' is formed by patterning the gate electrode material layer 206. In this step, the gate electrode material layer 206 is patterned and a protective film 208 is formed which protects at least a lower part 1 of the side face of the gate electrode 206' and a part 2 of the first insulating film 205 adjacent to the side face of the gate electrode 206'. The protective film 208 is typically also formed on the etching mask 207' and/or gate electrode material layer 206' as well. In the example shown in FIG. 2D, the protective film 208 is continuously formed so as to cover the side face of the gate electrode 206', the etching mask 207', the first insulating film 205 and the element separating film 202.

The gate electrode material layer 206 is patterned by removing, by etching, the portion of the gate electrode material layer 206 not covered with the etching mask 207'. For example, a mixed gas of $Cl_2$, HBr and $O_2$ can be used as a gas for etching the gate electrode material layer 206. The protective film 208 can be formed by reaction between silicon generated by etching of the gate electrode material layer 206 and the gas used for etching, that is, as a byproduct of etching of the gate electrode material layer 206. Alternatively, the protective film 208 may also be formed by introducing a gas for depositing the protective film 208 into a processing chamber after the etching of the gate electrode material layer 206 is completed. For example, a method of increasing the flow rate of HBr may be used. Note that during etching of the gate electrode material layer 206, the thickness of the etching mask 207' and the exposed portion of the first insulating film 205 may be reduced.

Figure 3A:
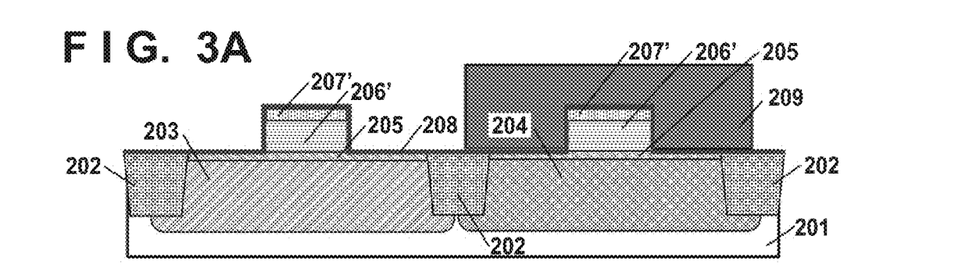
FIGS. 3A to 3D illustrate manufacturing steps of the semiconductor device corresponding to Embodiment 1 of the present invention.

Next, in a step shown in FIG. 3A, a photoresist pattern 209 is formed in the presence of the protective film 208. Next, in a step shown in FIG. 3B, phosphor, arsenic or the like is ion-implanted into the semiconductor substrate 201 using the photoresist pattern 209 as a mask. A diffusion region 210 is formed through this ion implantation. In that case, ions are also implanted into the photoresist pattern 209. The diffusion region 210 corresponds to, for example, an N-type LDD (Lightly Doped Drain). The dose of ion implantation can be optionally determined according to target performance of the MOS transistor, and in the case of an LDD, for example, the order of the fourteenth power can be selected (e.g., ranging from $1 \times 10^{14}$ atoms/$cm^2$ to $5 \times 10^{14}$ atoms/$cm^2$). Through this ion implantation, the photoresist pattern 209 is formed in a hardened layer 209' and a non-hardened layer 209".

Figure 8A:
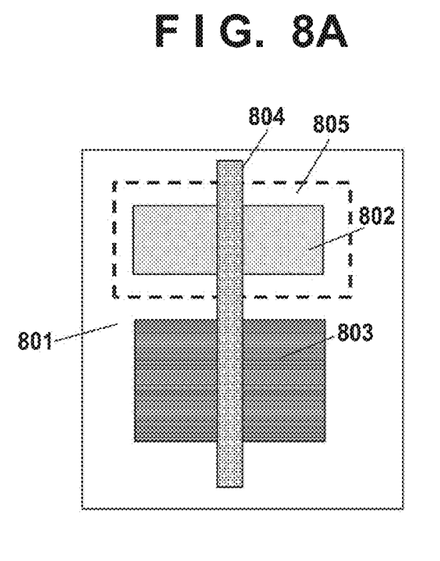
FIGS. 8A to 8C are explanatory diagrams of resist residues produced by an ion-implanted photoresist pattern.
Figure 8B:
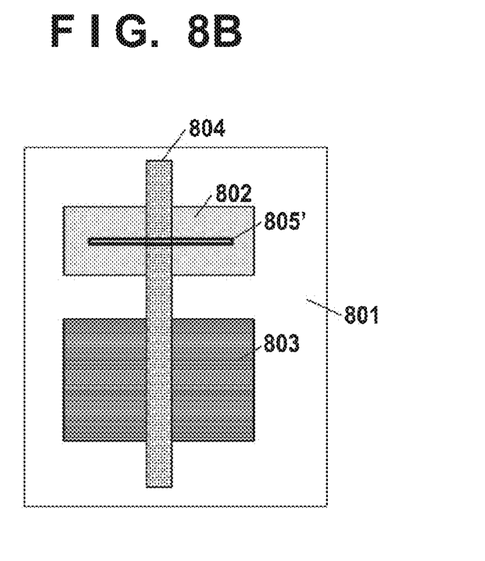

The photoresist pattern 209 can be removed by resist ashing (resist stripping process), but when the ion implanted photoresist is completely removed by resist ashing, resist residues may be generated after the ashing, depending on the dose of ion implantation. FIGS. 8A and 8B illustrate an example thereof and show a plan view of a pattern formed on a semiconductor substrate. In FIG. 8A, part of an element separating film 801 is opened, and an N-type diffusion region 802, a P-type diffusion region 803, and a gate electrode 804 are formed and a photoresist pattern 805 is formed so as to cover the N-type diffusion region 802.

FIG. 8B shows a situation immediately after ion implantation into the photoresist pattern 805 followed by resist ashing. When the line width of the photoresist pattern is smaller than the thickness of the photoresist, a resist residue denoted by reference numeral 805' may be generated depending on the dose of ion implantation. This residue derives from a coagulation made up of the remaining component of the photoresist and an ion-implanted impurity, and is generated near the center of the original photoresist pattern 805. As a result of the resist ashing advancing isotropically with respect to the photoresist, a resist residue is generated near the center where the photoresist pattern eventually disappears.

Figure 8C:
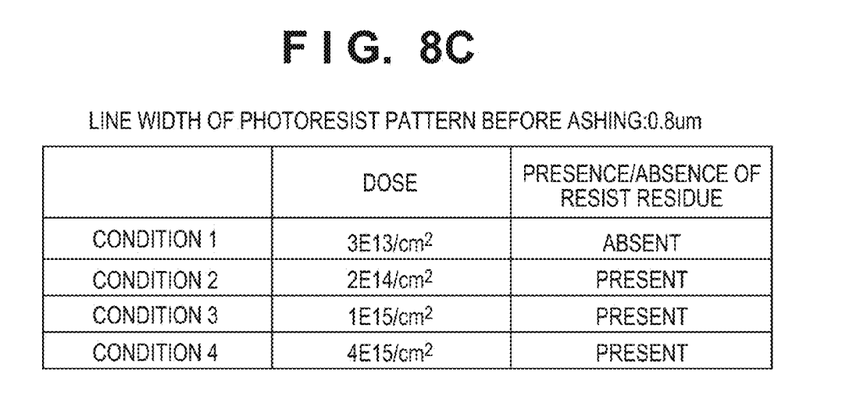

FIG. 8C shows an example illustrating a relationship between the dose of ions and the presence or absence of resist residues after resist asking. Here, FIG. 8C shows that when the dose is $3E13/cm^2$ ($3 \times 10^{13}$ atoms/$cm^2$, the same unit notation shall apply hereinafter), no resist residue is left, whereas resist residues are generated when the dose of ion implantation increases to the order of the fourteenth power such as $2E14/cm^2$, $1E15/cm^2$, $4E14/cm^2$ or more. The resist residues cannot be completely removed by cleaning with a sulfuric acid-hydrogen peroxide mixture (mixed solution of sulfuric acid and hydrogen peroxide). To completely remove the resist residues, it is necessary to perform further cleaning with an ammonium-hydrogen peroxide-water mixture (cleaning with a mixed solution of aqueous ammonium, hydrogen peroxide and water, hereinafter referred to as "SC-1 cleaning") after cleaning with the sulfuric acid-hydrogen peroxide mixture or cleaning with a hydrofluoric acid-based solution. However, these kinds of cleaning have an etching effect. Therefore, when SC-1 cleaning or hydrofluoric acid-based cleaning is performed to remove the resist residues in the condition of FIG. 3B, the protective film is wet-etched and part or the whole thereof is removed, which may consequently cause the function as the protective film to be lost. Also when there is no protective film, there is a possibility that, for example, the gate insulating film of the silicon oxide film may be wet-etched and part or the whole thereof may be removed, which may consequently cause reliability of the transistor to deteriorate.

Figure 3B:
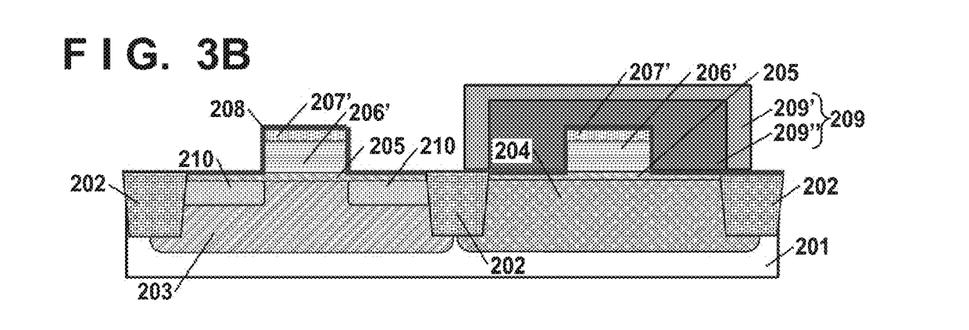
Figure 3C:
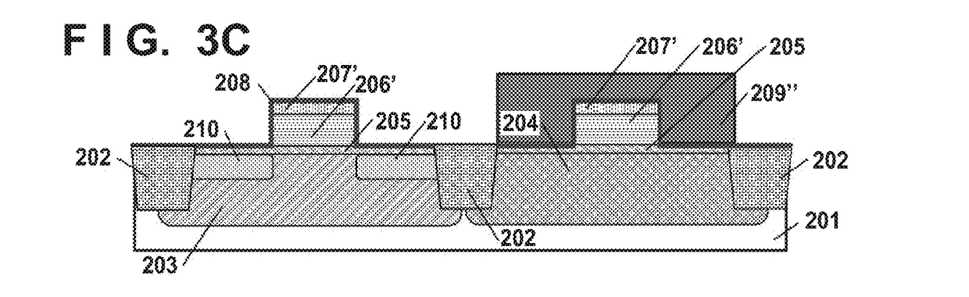
Figure 3D:
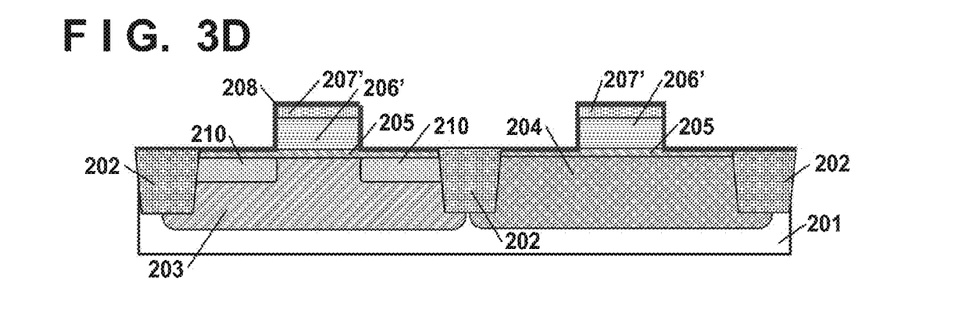

Returning to the description in FIGS. 3A to 3D, since the order of the fourteenth power is selected as the dose of ion implantation performed in FIG. 3B, if an attempt is made to completely remove the resist through resist ashing, resist residues may be generated. Thus, in the present embodiment, when ion implantation is performed into the photoresist 209 as shown in FIG. 3B, first resist ashing, which will be described later, is applied to remove the hardened layer 209' formed by ion implantation on one hand, and the non-hardened layer 209" is left on the other hand. To be more specific, in a step shown in FIG. 3C, the hardened layer 209' is removed through first resist ashing and the non-hardened layer 209" is left. At this time, the non-hardened layer 209" after the first resist ashing may be thinner than the non-hardened layer 209" before the first resist ashing in FIG. 3B. For example, $O_2$ can be used as a gas for the first resist ashing. Note that a gas that can be an etchant to the silicon oxide film is not used in the first resist ashing. For example, $CF_4$ or the like corresponds to this. The protective film 208 can be protected in this way. Next, in a step shown in FIG. 3D, cleaning with a sulfuric acid-hydrogen peroxide mixture is performed to remove the non-hardened layer 209". After removing the non-hardened layer 209", SC-1 cleaning or hydrofluoric acid-based cleaning is not performed. The protective film 208 is thereby protected.

Figure 4A:
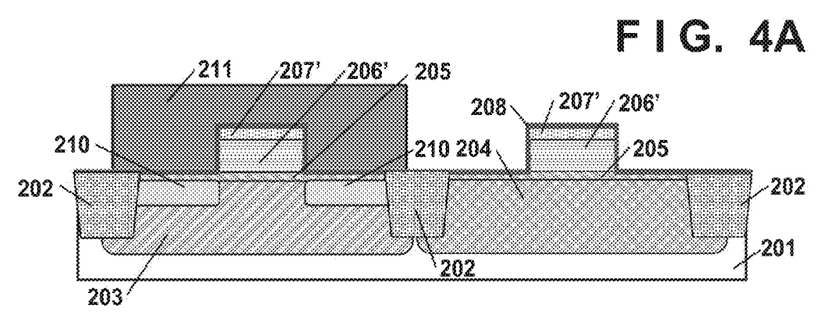
FIGS. 4A to 4D illustrate manufacturing steps of the semiconductor device corresponding to Embodiment 1 of the present invention.
Figure 4B:
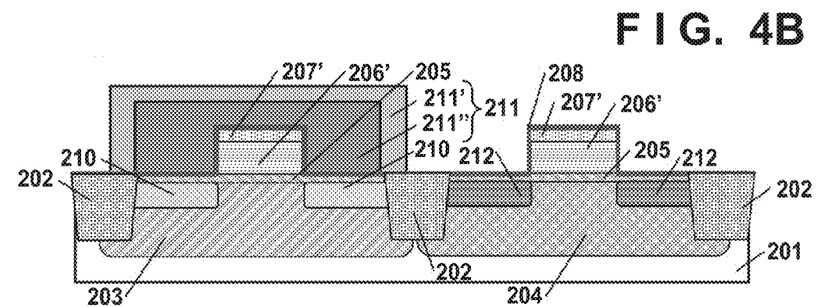

Next, in a step shown in FIG. 4A, a photoresist pattern 211 is formed in the presence of the protective film 208. Next, in a step shown in FIG. 4B, boron or the like is ion-implanted into the semiconductor substrate 201 using the photoresist pattern 211 as a mask. A diffusion region 212 is formed through this ion implantation. In this case, ions are also implanted into the photoresist pattern 211. The diffusion region 212 corresponds to, for example, a P-type LDD (Lightly Doped Drain). The dose of ion implantation can be optionally determined by target performance of the MOS transistor, but in the case of an LDD, for example, the order of the fourteenth power can be selected. Through this ion implantation, the photoresist pattern 211 is formed in the hardened layer 211' and the non-hardened layer 211".

Figure 4C:
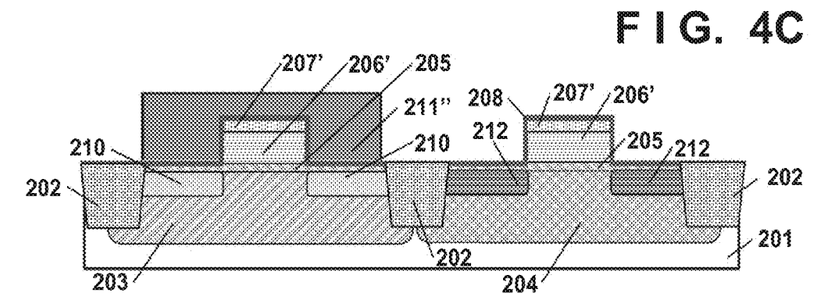
Figure 4D:
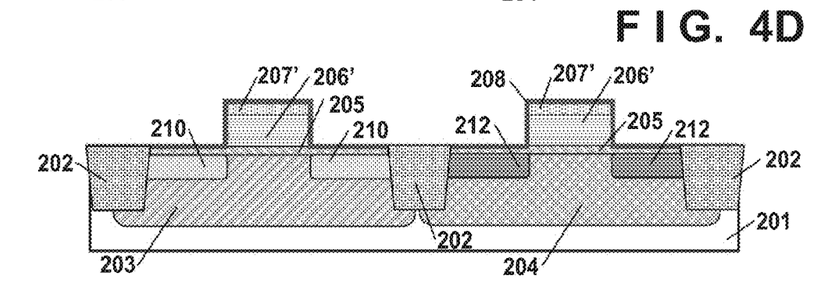

At this time, since the order of the fourteenth power is selected for the dose of ion implantation, when an attempt is made to completely remove the resist through resist asking, resist residues may be generated. Thus, in a step shown in FIG. 4C, the hardened layer 211' is removed by first resist ashing and the non-hardened layer 211" is left. The non-hardened layer 211" after the first resist ashing may be thinner than the non-hardened layer 211" before the first resist ashing in FIG. 4B. $O_2$, for example, is used as a gas for resist ashing. A gas such as $CF_4$ that can be an etchant to the silicon oxide film is not used. In this way, the protective film 208 is protected. Next, in a step shown in FIG. 4D, cleaning with a sulfuric acid-hydrogen peroxide mixture is performed to remove the non-hardened layer 211". Note that after removing the non-hardened layer 211", SC-1 cleaning or hydrofluoric acid-based cleaning is not performed. The protective film 208 is retained in this way and the transistor covered with the protective film is also protected.

Figure 5A:
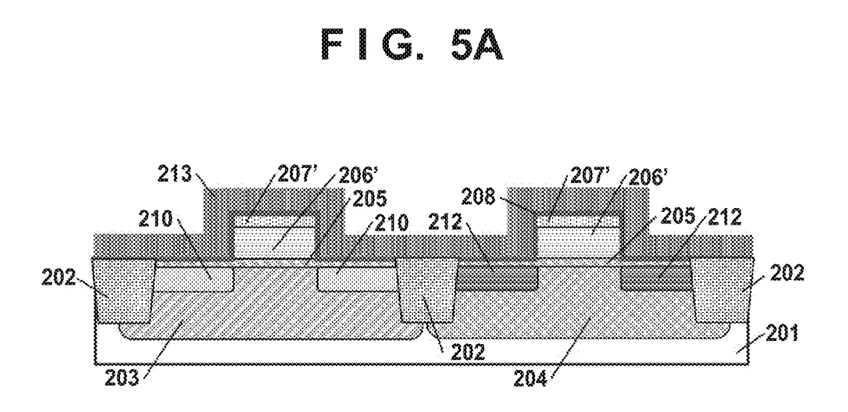
FIGS. 5A and 5B illustrate manufacturing steps of the semiconductor device corresponding to Embodiment 1 of the present invention.

Next, in a step shown in FIG. 5A, an insulating film 213 is formed on the protective film 208. The insulating film 213 may be a single layer film or a multi-layered film made up of different types of films. For example, there can be a multi-layered film including a silicon oxide film and a silicon nitride film or the like. Here, forming the insulating film 213 so as to cover the protective film 208 when forming the gate electrode 206' means forming the insulating film 213 without removing the formed protective film 208.

Figure 5B:
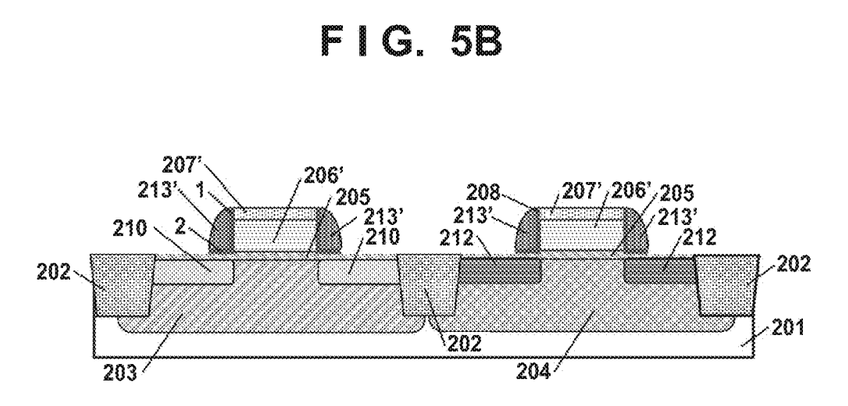

Next, in a step shown in FIG. 5B, a side spacer 213' is formed by etching back the insulating film 213. In this way, parts of the protective film 208 and the insulating film 213 mainly covering the side face of the gate electrode 206' are left. In that case, the region of the protective film 108 not covered with the side spacer may become thinned or be removed by etching back. A lower part 1 of the side face of the gate electrode 206' and a part 2 adjacent to the side face of the gate electrode 206' of the first insulating film 205 are protected by the protective film 208' and the side spacer 213'.

As described above, the first resist ashing is performed in the resist stripping step after ion implantation performed in steps of gate electrode etching to side spacer deposition. In this first resist ashing, an $O_2$ gas is used in a first stage first, and of a hardened layer in which the surface of the photoresist is hardened under the influences of ion implantation and a non-hardened layer which is not hardened, the non-hardened layer is left. Next, in a second stage, cleaning with a sulfuric acid-hydrogen peroxide mixture is performed to remove the non-hardened layer. Only the non-hardened layer is left in the first stage because if the hardened layer is left, it is difficult to peel the photoresist by cleaning with a sulfuric acid-hydrogen peroxide mixture on one hand, and removing even the non-hardened layer by the first resist ashing may cause resist residues to be generated on the other. Since resist residues are not generated by such first resist ashing, it is not necessary to apply SC-1 cleaning or hydrofluoric acid-based cleaning to remove resist residues. The protective film is thereby retained.

Figure 6A:
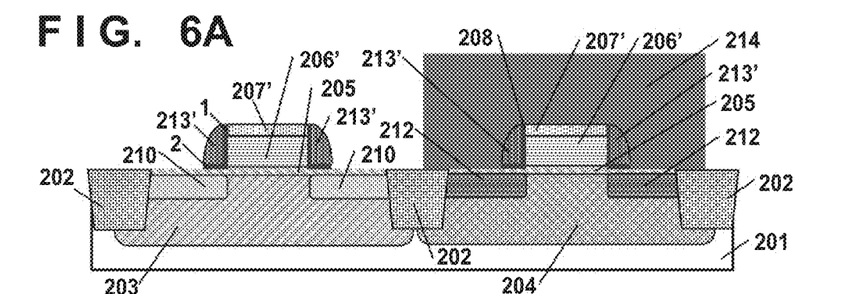
FIGS. 6A to 6D illustrate manufacturing steps of the semiconductor device corresponding to Embodiment 1 of the present invention.
Figure 6B:
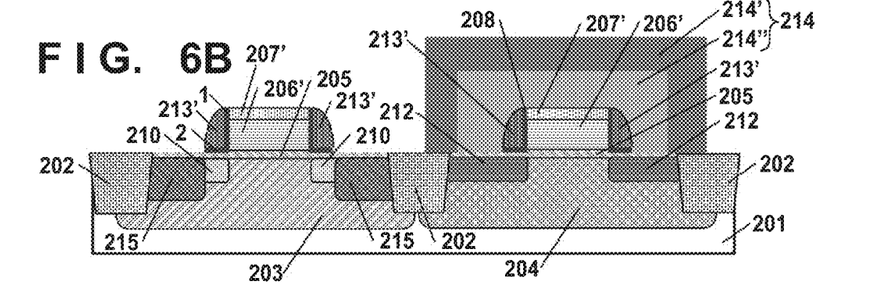

Next, steps after forming the side spacer 213' will be further described. In a step shown in FIG. 6A, a photoresist pattern 214 is formed. Next, in a step shown in FIG. 6B, phosphor or arsenic or the like is ion-implanted into the semiconductor substrate 201 using the photoresist pattern 214 as a mask. An N+ diffusion region 215 is formed through this ion implantation. In that case, ion implantation is applied to the photoresist pattern 214 as well. The diffusion region 215 corresponds to, for example, an N-type source/drain. The dose of ion implantation may be optionally determined according to target performance of the MOS transistor, but in the case of the source/drain, the order of the fifteenth power can be selected (e.g., range of $1\times10^{15}$ atoms/cm$^2$ to $6\times10^{15}$ atoms/cm$^2$), for example. Through this ion implantation, the photoresist pattern 214 is formed in a hardened layer 214' and a non-hardened layer 214".

Figure 6C:
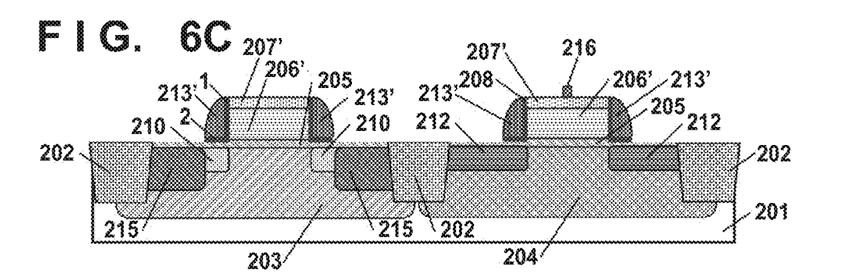

At this time, since the order of the fifteenth power is selected for the dose of ion implantation, when an attempt is made to completely remove the resist by resist ashing as shown in FIG. 6C, resist residues may be generated. However, the side spacer 213' is already formed and the protective film 208 is thereby protected at this point in time. Thus, in a step shown in FIG. 6C, both the hardened layer 214' and the non-hardened layer 214" are removed through second resist ashing. For example, $O_2$ can be used as a gas for the second resist ashing. Since the protective film 208 covering the side face of the gate electrode 206' is protected by the side spacer 213', $CF_4$ which may become an etchant to the silicon oxide film can be used. A resist residue 216 that can be generated in that case may be left even after cleaning with a sulfuric acid-hydrogen peroxide mixture which may be performed after the resist ashing. Next, in a step shown in FIG. 6D, SC-1 cleaning or hydrofluoric acid-based cleaning is performed. The residue 216 is removed by this cleaning. Part of the element separating film 202, diffusion regions 212 and 215, etching mask 207', side spacer 213' and protective film 208' may be etched through this cleaning, whereas the lower part 1 of the side face of the gate electrode 206' and the part 2 of the first insulating film 205 adjacent to the side face of the gate electrode 206' are protected from etching by the protective film 208' and the side spacer 213'.

Figure 7A:
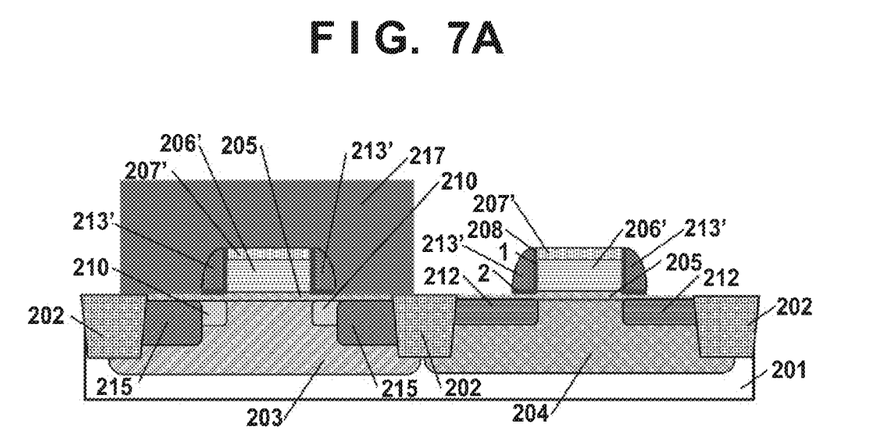
FIGS. 7A to 7E illustrate manufacturing steps of the semiconductor device corresponding to Embodiment 1 of the present invention.
Figure 7B:
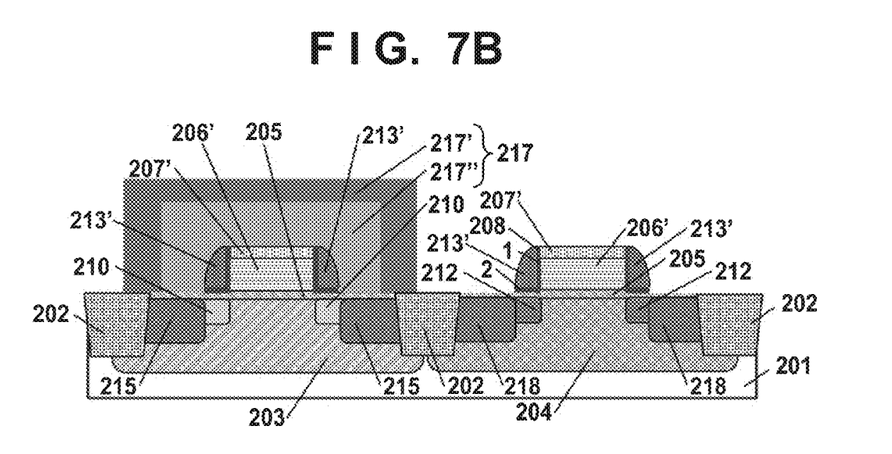

Next, in a step shown in FIG. 7A, a photoresist pattern 217 is formed. Next, in a step shown in FIG. 7B, boron or the like is ion-implanted into the semiconductor substrate 201 using the photoresist pattern 217 as a mask. A P-type diffusion region 218 is formed by this ion implantation. In that case, ion implantation is applied to the photoresist pattern 217 as well. The diffusion region 218 corresponds to, for example, a P-type source/drain. The dose of ion implantation can be optionally determined according to target performance of the MOS transistor, and in the case of a source/drain, the order of the fifteenth power can be selected. A hardened layer 217' is formed in the photoresist pattern through this ion implantation. Reference numeral 217" denotes a non-hardened layer.

Figure 7C:
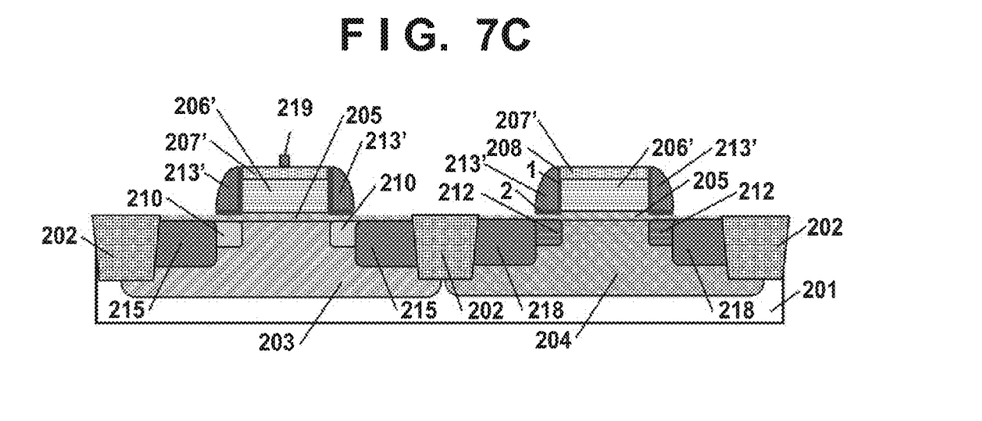

Next, in a step shown in FIG. 7C, both the hardened layer 217' and the non-hardened layer 217" are removed by second resist ashing as in the case of FIG. 6C. In that case, a resist residue 219 may be generated. This residue 219 may be left even after cleaning with a sulfuric acid-hydrogen peroxide mixture performed after the resist ashing. Next, in a step shown in FIG. 7D, SC-1 cleaning or hydrofluoric acid-based cleaning is performed. The residue 219 is removed by this cleaning. Part of the element separating film 202, diffusion regions 215 and 218, etching mask 207', side spacer 213' and protective film 208' may be etched by this cleaning, but the lower part 1 of the side face of the gate electrode 206' and the part 2 of the first insulating film 205 adjacent to the side face of the gate electrode 206' are protected from etching by the protective film 208' and the side spacer 213'.

Figure 7D:
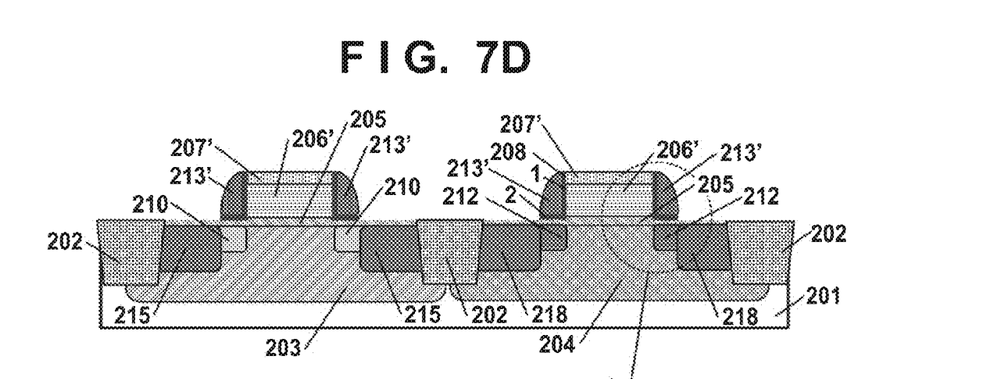
Figure 7E:
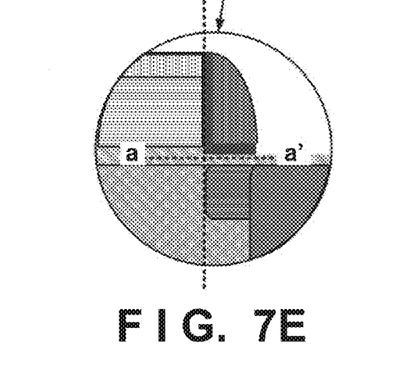

FIG. 7E is an enlarged view of the cross section of the MOS transistor after forming a side spacer shown in FIG. 7D. As shown here, since the process of second resist ashing is performed with the protective film 208 being protected by the side spacer 213', it is possible to keep the plane between the silicon surface 205 immediately below the gate electrode 206', the protective film 208 adjacent thereto and the silicon surface 205 immediately below the side spacer 213' (plane shown by a-a') substantially flat.

Thus, in the resist stripping step after ion implantation performed from the formation of the side spacer 213' onward, second resist ashing is performed. In this second resist ashing, both the hardened layer and the non-hardened layer formed on the photoresist through ion implantation are removed, but resist residues may be generated in that case. Thus, cleaning with a sulfuric acid-hydrogen peroxide mixture is applied, and further SC-1 cleaning or hydrofluoric acid-based cleaning is applied. The resist residues are removed by this cleaning, and at the same time, part of silicon or silicon oxide film on the semiconductor substrate is etched. However, since the side spacer is formed so as to cover the protective film at this point in time, the location of the protective film covered with the side spacer is retained and not affected by SC-1 cleaning or hydrofluoric acid-based cleaning.

As described above, according to the present embodiment, it is possible to apply different resist stripping processes in the resist stripping step (first resist ashing) after ion implantation performed in steps of gate electrode etching to side spacer deposition, and the resist stripping step (second resist ashing) after ion implantation performed from the side spacer formation onward, and peel the resist while protecting the protective film.

Embodiment 2

Hereinafter, Embodiment 1 will be supplemented regarding the method of forming a photoresist pattern after the side spacer formation. The present embodiment has a feature of adopting a minimum allowable size in design for the photoresist pattern to be used in the ion implantation step of forming an N-type diffusion region and a P-type diffusion region from the side spacer forming step onward. These ion implantation steps are generally intended to form an N+ source/drain and P+ source/drain, and the dose of ion implantation described in connection with FIG. 6B and FIG. 7B becomes as high as the order of the fifteenth power. Since the dose is high, the photoresist pattern acquires conductivity during ion implantation, producing a kind of antenna effect. This antenna effect may cause charge-up damage. The antenna effect increases when the area of a conductive body that accumulates charge is large. For this reason, by minimizing the area of the resist that can become an antenna, it is possible to reduce charge-up damage.

Figure 9A:
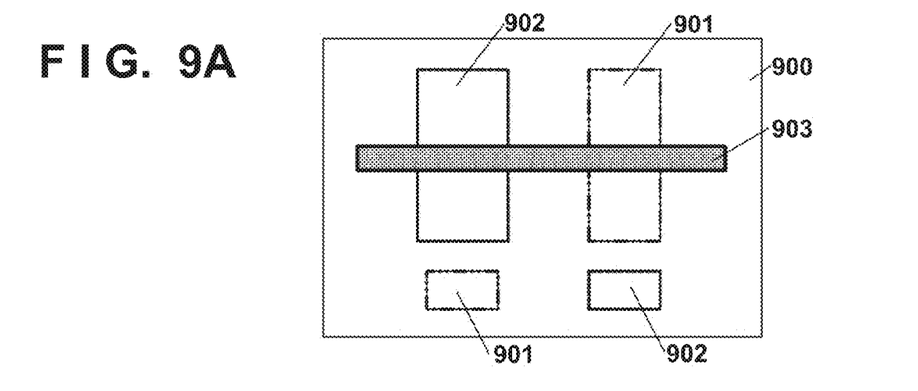
FIGS. 9A to 9C are explanatory diagrams of a method for forming a photoresist pattern corresponding to Embodiment 2 of the present invention.

Hereinafter, details of the present embodiment will be described using FIGS. 9A to 9C. FIG. 9A is an example two-dimensionally illustrating a pattern formed on a semiconductor substrate. An element separation region 900 includes a region 901 in which an N-type diffusion region is formed through ion implantation, a region 902 in which a P-type diffusion region is formed through ion implantation and a gate electrode 903. Although a side spacer (reference numeral 213 in FIG. 6A or the like) is formed around the gate electrode 903, this is omitted in FIG. 9A for simplicity.

Figure 9B:
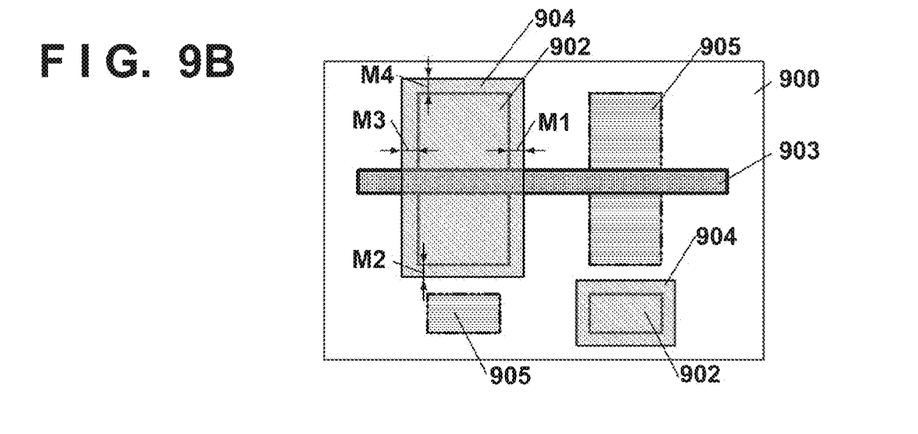

First, in a step shown in FIG. 9B, by covering the region 902 for forming the P-type diffusion region with a photoresist pattern 904 and applying ion implantation of phosphor or arsenic thereto, an N-type diffusion region 905 is formed. This process corresponds to those in FIGS. 6A and 6B. The dose of ion implantation can be optionally determined according to target performance of the MOS transistor, but when an N-type source/drain is formed, the dose is generally the order of the fifteenth power. The mask used for ion implantation is one whose light-shielding portion is defined so as to cover the region 902 for forming a P-type diffusion region with a resist of a minimum allowable area according to design rules. Here, the minimum area of the photoresist pattern 904 is identified by adding to the region 902, a margin predetermined in the design rules. For example, when a margin of 0.1 µm is specified in the design rules, margins M1 to M4, which are margins of four sides of the photoresist pattern 904 corresponding to four sides making up the region 902 have 0.1 µm. The margin value is specified according to the design rules and can be, for example, 0.05 µm or 0.2 µm without being limited to 0.1 µm. Thus, the photoresist pattern 904 formed on the semiconductor substrate is formed so as to cover the region 902 for forming the P-type diffusion region with a minimum allowable area according to the design rules.

Figure 6D:
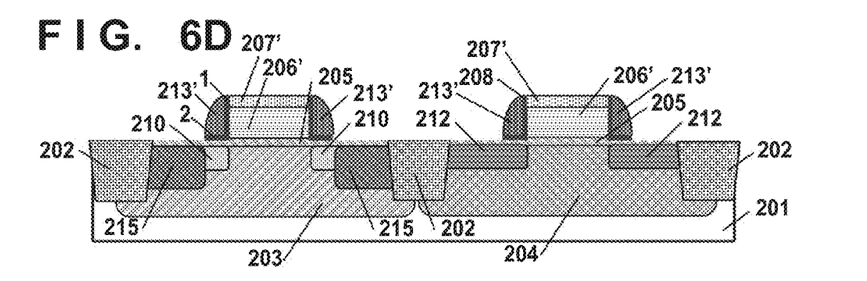

The hardened layer and the non-hardened layer of the resist pattern formed in this way are removed using second resist ashing after ion implantation, and resist residues that can be generated (corresponding to FIG. 6C) are removed through SC-1 cleaning or hydrofluoric acid-based cleaning after cleaning with a sulfuric acid-hydrogen peroxide mixture, resulting in a state corresponding to FIG. 6D.

Figure 9C:
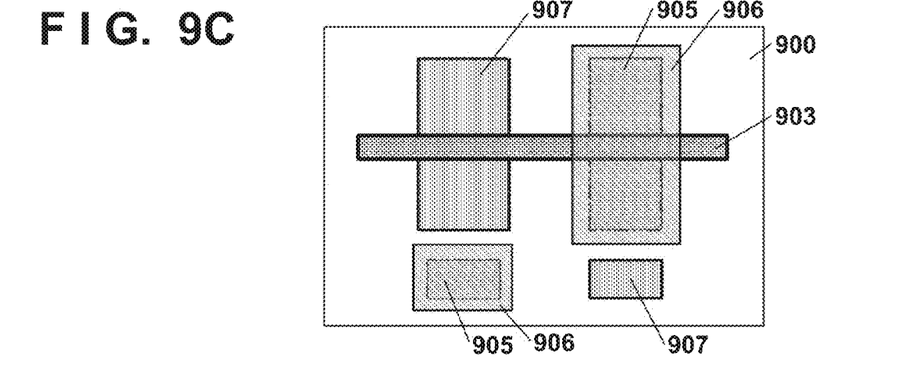

Next, in a step shown in FIG. 9C, by covering the region 901 for forming the N-type diffusion region with a photoresist pattern 906 and applying ion implantation of boron or the like thereto, a P-type diffusion region 907 is formed. The process corresponds to those in FIGS. 7A and 7B. The dose of ion implantation can be optionally determined according to target performance of the MOS transistor, but when a P-type source/drain is formed, the dose generally becomes the order of the fifteenth power. The mask used for ion implantation is one whose light-shielding portion is defined so as to cover the region 901 for forming an N-type diffusion region with a resist of a minimum allowable area according to design rules. Thus, the photoresist pattern 906 formed on the semiconductor substrate is formed so as to cover the region 901 for forming the N-type diffusion region with a minimum allowable area according to design rules.

The hardened layer and the non-hardened layer of the resist pattern formed in this way are removed by second resist ashing after ion implantation, resist residues that can be generated (corresponding to FIG. 7C) are removed through SC-1 cleaning or hydrofluoric acid-based cleaning after cleaning with a sulfuric acid-hydrogen peroxide mixture, resulting in a state corresponding to FIG. 7D.

As described above, in the ion implantation step for the purpose of forming a source/drain of a transistor, it is possible to reduce an antenna effect by a photoresist pattern and reduce charge-up damage.

Embodiment 3

Hereinafter, Embodiments 1 and 2 will be supplemented regarding the method for forming a photoresist pattern before forming a side spacer. For the purpose of widening a process margin to leave the non-hardened layer of the photoresist, the present embodiment calculates layout data of the mask used in an ion implantation step before forming a side spacer through a calculation process using a method of including an implantation region of ion implantation.

Figure 10A:
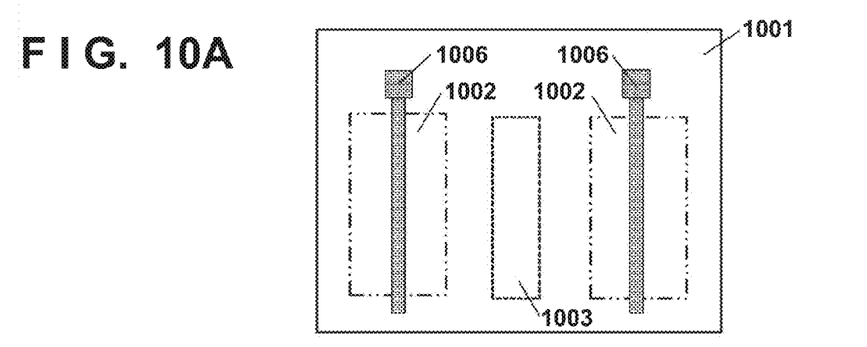
FIGS. 10A to 10C are explanatory diagrams of a method for forming a photoresist pattern corresponding to Embodiment 3 of the present invention.
Figure 10B:
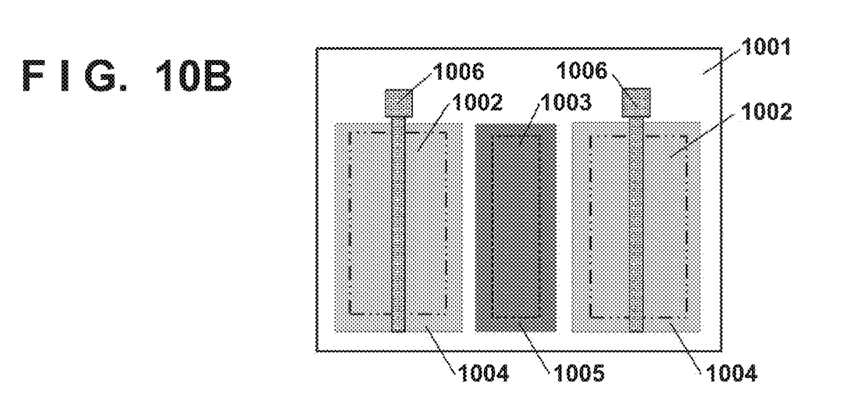

Hereinafter, details of the present embodiment will be described using FIGS. 10A to 10C. Reference numeral 1000 in FIG. 10A shows an example of layout data when layout data of a mask used in an ion implantation step applied in steps after formation of a gate electrode until side spacer deposition is generated through a calculation process. In this calculation process, the present embodiment uses any one of layout data for forming an N-type diffusion region after the formation of the side spacer and layout data for forming a P-type diffusion region.

First, reference numeral 1001 in FIG. 10A denotes a P-type well region, 1002 denotes a diffusion region to be a target of the ion implantation and 1003 denotes a diffusion region other than the ion implantation target. Reference numeral 1006 denotes a gate electrode layer. Reference numeral 1004 in FIG. 10B denotes a layer for forming a P-type diffusion region and is laid out so as to cover the region 1002 which becomes an N-type diffusion region with a minimum area. Reference numeral 1005 denotes a layer for forming an N-type diffusion region and is laid out so as to cover the region 1003 which becomes a P-type diffusion region with a minimum area.

Here, the diffusion region 1002 which becomes an ion implantation target is opened and the layer 1004 for forming the P-type diffusion region including the ion implantation target region is used to generate layout of masking the diffusion region 1003 which is other than the ion implantation target by the calculation process. In this case, data of 1004 for forming the P-type diffusion region is subtracted from data of the P-type well 1001, data 1007 in FIG. 9C is created and this is used as a light-shielding region. The line width of the photoresist pattern formed on the semiconductor substrate at this time is R. Using this as a mask, ion implantation is applied to the diffusion region 1002 to form a diffusion region 1008.

Figure 10C:
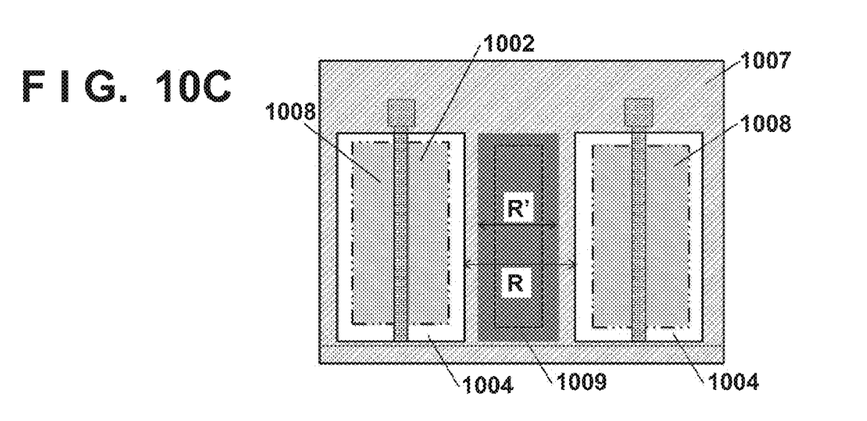

On the other hand, when using the layer 1005 for forming the N-type diffusion region which includes no ion implantation target region for the calculation process, data of the P-type well 1001 and data of the layer 1005 for forming the N-type diffusion region are ANDed to form data 1009 in FIG. 10C, which is used as a light-shielding region. The line width of the photoresist pattern formed on the semiconductor substrate at this time is R'. Note that since the layer 1002 for forming the N-type diffusion region and the layer 1003 for forming the P-type diffusion region are laid out so as to minimize the area of the light-shielding portion, the line width of R is equal to or greater than that of R'.

Therefore, the present embodiment forms a photoresist pattern using the layer 1004 for forming the P-type diffusion region including the ion implantation target region, and can thereby widen the process margin when leaving the non-hardened layer through first resist asking.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-097110, filed May 8, 2014, which is hereby incorporated by reference herein in its entirety.

What is claimed is:
1. A method for manufacturing a semiconductor device including a MOS transistor, the method comprising:
   a step of forming a gate electrode on a first insulating film formed on a semiconductor substrate by etching a gate electrode material layer formed on the first insulating film, and forming a protective film to cover at least a lower part of a side face of the gate electrode and a part of the first insulating film adjacent to the side face;
   a step of forming a first resist pattern to cover the gate electrode and the protective film;
   a step of forming a first diffusion region by performing ion implantation into the semiconductor substrate using the first resist pattern as a mask;
   a first removing step of removing the first resist pattern, which covers the gate electrode and the protective film, wherein the first removing step includes ashing the first resist pattern and then cleaning the semiconductor substrate with a sulfuric acid-hydrogen peroxide mixture;
   a step of forming a second insulating film to cover the gate electrode and the protective film after the first removing step;
   a step of forming a side spacer at a side of the gate electrode from the second insulating film by etching the second insulating film such that the side spacer is arranged to cover a portion of the protective film, which covers, under the side spacer, the lower part of the side face of the gate electrode and the part of the first insulating film adjacent to the side face;
   a step of forming a second resist pattern to cover the side spacer, which covers the portion of the protective film;

a step of forming a second diffusion region by performing ion implantation into the semiconductor substrate using the second resist pattern as a mask; and a second removing step of removing the second resist pattern, wherein the second removing step includes ashing the second resist pattern and then cleaning the semiconductor substrate with an ammonium-hydrogen peroxide-water mixture or hydrofluoric acid-based cleaning, and wherein in the cleaning in the second removing step, the lower part of side face of the gate electrode and the part of the first insulating film are protected from etching by the portion of the protective film and the side spacer.

2. The method according to claim 1, wherein in the first removing step, the first resist pattern is removed without using an ammonium-hydrogen peroxide-water mixture or hydrofluoric acid-based cleaning.

3. The method according to claim 1, wherein the ashing in the first removing step is performed using an $O_2$ gas.

4. The method according to claim 1, wherein the ion implantation in the step of forming the first diffusion region is performed with a dose ranging from $1\times10^{14}$ atoms/cm$^2$ to $5\times10^{14}$ atoms/cm$^2$.

5. The method according to claim 1, wherein the ion implantation in the step of forming the second diffusion region is performed with a dose ranging from $1\times10^{15}$ atoms/cm$^2$ to $6\times10^{15}$ atoms/cm$^2$.

6. The method according to claim 1, wherein the semiconductor device comprises a solid-state image sensor.

7. The method according to claim 1, wherein the first insulating film comprises a silicon oxide film.

8. The method according to claim 1, wherein the ashing in the first removing step is performed using an $O_2$ gas, and the ashing in the second removing step is performed using a $CF_4$ gas.

9. The method according to claim 1, wherein in the step of forming the gate electrode, the protective film is formed based on a reaction between silicon contained in the gate electrode material layer and generated by the etching of the gate electrode material layer and a gas used for the etching of the gate electrode material layer, wherein the gas is a mixed gas of $Cl_2$, HBr, and $O_2$.

10. The method according to claim 1, wherein in the first removing step, the ashing is performed using a gas that does not act as an etchant for the protective film.

11. The method according to claim 1, wherein the ion implantation in the step of forming the first diffusion region is performed with a first dose, and the ion implantation in the step of forming the second diffusion region is performed with a second dose higher than the first dose.

12. The method according to claim 1, wherein the second removing step further includes cleaning the semiconductor substrate with a sulfuric acid-hydrogen peroxide mixture after the ashing of the second removing step.

13. The method according to claim 12, wherein the cleaning with the ammonium-hydrogen peroxide-water mixture or the hydrofluoric acid-based cleaning of the second removing step is performed after cleaning with the sulfuric acid-hydrogen peroxide mixture.

14. The method according to claim 1, wherein in the step of forming the gate electrode, the gate electrode material layer formed on the semiconductor substrate is etched to form the gate electrode using an etching mask on the gate electrode material layer, and the etching mask is covered with the first resist pattern in the step of forming the first resist pattern.

15. The method according to claim 14, wherein the etching mask is covered with the second resist pattern in the step of forming the second resist pattern.

16. The method according to claim 6, wherein the first diffusion region and the second diffusion region are included in a P-type drain of a MOS transistor other than the MOS transistor including the gate electrode.

17. The method according to claim 14, wherein the etching mask comprises a silicon oxide film.

18. The method according to claim 17, wherein the protective film is formed such that the protective film contacts the part of the first insulating film.

19. The method according to claim 1, wherein in the step of forming the second diffusion region, ions are implanted into the semiconductor substrate through the side spacer and the portion of the protective film.

20. The method according to claim 1, wherein a thickness of the part of the first insulating film adjacent to the side face is smaller than a thickness of the first insulating film under the gate electrode.

21. The method according to claim 1, wherein after the second removing step, a thickness of the part of the first insulating film adjacent to the side face is smaller than a thickness of the first insulating film under the gate electrode.

* * * * *